United States Patent [19]
Shindo et al.

[11] Patent Number: 5,810,983
[45] Date of Patent: Sep. 22, 1998

[54] HIGH PURITY COBALT SPUTTERING TARGETS

[75] Inventors: Yuichiro Shindo; Tsuneo Suzuki, both of Toda, Japan

[73] Assignee: Japan Energy Corporation, Tokyo, Japan

[21] Appl. No.: 790,033

[22] Filed: Jan. 28, 1997

Related U.S. Application Data

[62] Division of Ser. No. 615,005, Mar. 12, 1996, Pat. No. 5,667,665.

[30] Foreign Application Priority Data

Mar. 14, 1995 [JP] Japan .................................. 7-080831
Feb. 23, 1996 [JP] Japan .................................. 8-060362

[51] Int. Cl.$^6$ .................................................. C22C 19/07
[52] U.S. Cl. .................................. 204/298.13; 420/435
[58] Field of Search ........................ 204/298.13; 420/435

[56] References Cited

U.S. PATENT DOCUMENTS

| | | | |
|---|---|---|---|
| 3,235,377 | 2/1966 | Hard | 75/717 |
| 3,673,062 | 6/1972 | Smith | 205/589 |
| 3,903,235 | 9/1975 | Cardwell | 423/24 |
| 4,606,885 | 8/1986 | Miller et al. | 419/39 |
| 5,196,916 | 3/1993 | Ishigami et al. | 204/298.13 |
| 5,217,585 | 6/1993 | Snyder | 205/589 |

FOREIGN PATENT DOCUMENTS

| | | |
|---|---|---|
| 63-238268 | 10/1988 | Japan ........................ 204/298.13 |
| 05179435 | 7/1993 | Japan ........................ 204/298.13 |
| 06192874 | 7/1994 | Japan . |
| 07003486 | 1/1995 | Japan . |
| 7-003486 | 1/1995 | Japan . |
| 08127890 | 5/1996 | Japan . |

OTHER PUBLICATIONS

DuBois, B., et al., "Purification of cobalt chloride by solvent extraction and by ion exchange chromatography," *Mem. Sci. Rev. Met.*, 66(9), 683–90 (with attached Chemical Abstract 72:114437).

Kuster, T., "Superalloy scrap metal recovery," American Metal Market, p. 4.

Obata, Takeshi et al, Bunseki Kagaku (1994), 43(9) 697–702 "Determination of Traceimpurities in High Purity Cobalt by Glow Discharge MS".

*Primary Examiner*—Margery Phipps
*Attorney, Agent, or Firm*—Seidel, Gonda, Lavorgna & Monaco, PC

[57] ABSTRACT

A process for producing a high purity cobalt is provided comprising the following steps. An aqueous solution of cobalt chloride having a hydrochloric acid concentration of 7 to 12N is provided. The solution includes either or both of Fe and Ni as impurities. The solution is contacted with an anion exchange resin so that cobalt is adsorbed on the resin. Cobalt is eluted from the resin with hydrochloric acid at a concentration of 1 to 6N. The solution containing the eluted cobalt is dried or otherwise concentrated to produce a purified aqueous solution of cobalt chloride having a pH of 0 to 6. Organic materials are preferably removed from the purified solution by active carbon treatment. Electrolytic refining is conducted with the purified aqueous solution as an electrolyte to obtain electrodeposited cobalt. A high purity cobalt sputtering target can be obtained wherein Na content is 0.05 ppm or less; K content is 0.05 ppm or less; Fe content is 1 ppm or less; Ni content is 1 ppm or less; Cr content is 1 ppm or less; U content is 0.01 ppb or less; Th content is 0.01 ppb or less; C content is 50 ppm or less, preferably 10 ppm or less; and O content is 100 ppm or less, the balance being cobalt and unavoidable impurities.

2 Claims, No Drawings

HIGH PURITY COBALT SPUTTERING TARGETS

This is a divisional of copending application Ser. No. 08/615,005 filed on Mar. 12, 1996, now U.S. Pat. No. 5,667,665.

FIELD OF THE INVENTION

This invention relates to a process of producing high purity cobalt and a high purity cobalt sputtering target manufactured using the cobalt. The high purity cobalt produced according to this invention is very pure and includes minimum amounts of alkali metal elements, radioactive elements, and transition metal elements. It also further includes gas or gasifiable components in minimum amounts. The high purity cobalt is suitably used as a target material for forming VLSI electrodes and conductors or wirings, and various films and other components.

BACKGROUND OF THE INVENTION

Polysilicon has hitherto been used in electrodes or conductors of LSI semiconductor devices. Accompanied with the tendency toward higher integration of LSI semiconductor devices, silicides of molybdenum and tungsten have been widely utilized. Increasing attention is now paid to the practical use of the silicides of titanium and cobalt. Also, trials are progressing using cobalt as conductors or wirings instead of the Al or Al alloys hitherto used. The electrodes or conductors or wirings of cobalt or cobalt silicide are typically formed by sputtering a cobalt target in an argon atmosphere.

It is important to note that semiconductor members formed after sputtering include metal impurities detrimental to semiconductor devices in minimum quantities. That is, it is important that the following are minimized: (1) alkali metals such as Na and K, (2) radioactive elements such as U and Th and (3) transition metals such as Fe, Ni and Cr.

The alkali metals such as Na and K easily move in gate insulation films and may cause the deterioration of MOS-LSI interface characteristics. And, radioactive elements such as U and Th may cause soft errors in device elements owing to alpha rays emitted from these radioactive elements. On the other hand, heavy metals such as Fe, Ni and Cr also may cause problems in connections at the interface.

Commercially available cobalt, so-called crude cobalt lump, contains tens of ppm Fe and several hundred ppm Ni as impurities. Electrolytic refining is first considered for producing high purity cobalt from this crude material. However, since the standard electrode potentials of Ni and Fe impurities on the one hand and Co on the other hand are very near to each other, high purification is difficult to achieve with normal electrolytic refining operation.

For purification by electrolytic refining, it is necessary to remove the impurities in the electrolyte by a solvent extraction process, while maintaining the concentrations of Ni and Fe in the electrolyte to no more than 1.3 mg/l on average and no more than 0.1 mg/l on average, respectively, in the case where the Co concentration in the electrolyte is 40 to 60 g/l. This necessitates very strict control. Further, removal of Ni by solvent extraction requires a special solvent such as ALKYLOXYM. The operation is complex since cobalt is co-extracted. Further, there is a problem that the extracting solvent dissolves into the electrolyte to incur a loss of solvent.

In addition, as another problem, there is sometimes found the phenomenon that electro-deposited cobalt peels off from a cathode sheet. It has also been pointed out that there are cases where it is difficult to lower the gas component, inclusive of gaseous components and gasifiable components such as carbon, oxygen and others of electrodeposited cobalt. Gas components such as carbon and oxygen are considered to be undesirable since when cobalt is used for sputtering target applications, the gas component gives rise to particle generation.

OBJECT OF THE INVENTION

An object of this invention is to establish a process capable of stably and easily producing a high purity cobalt having a purity level of 5N (99.999%, noted hereinafter simply as 5N) or higher which includes minimum quantities of alkali metal elements, radioactive elements and transition metal elements, and which is suitable for production of sputtering targets and other applications.

Another object of this invention is to establish a process capable of stably and easily producing a high purity cobalt having a purity level of 5N or higher which not only includes minimum quantities of alkali metal elements, radioactive elements and transition metal elements, but also includes minimum quantities of gas components and other impurities, and which is suitable for production of sputtering targets and other applications.

A further object of this invention is to provide a high purity cobalt sputtering target having a purity level of 5N or higher which not only includes minimum quantities of alkali metal elements, radioactive elements and transition metal elements, but also includes minimum quantities of gas components and other impurities.

SUMMARY OF THE INVENTION

The inventors, after widely studying the goal of stably producing a high purity cobalt, have found that by using a combined anion exchange process-electrolytic refining process, further combined with a vacuum melting process as necessary, a high purity cobalt may be stably and easily produced at low cost and on a mass-production basis.

On the basis of the above findings, this invention provides a process for producing a high purity cobalt comprising the steps of:

(a) contacting an aqueous solution of cobalt chloride having a hydrochloric acid concentration of 7 to 12N, said solution including at least either or both of Fe and Ni as impurities, with an anion exchange resin so that cobalt is adsorbed on the anion exchange resin;

(b) eluting the cobalt with the use of hydrochloric acid as an eluting solution having a concentration of 1 to 6N;

(c) vaporizing and drying or otherwise concentrating the solution having cobalt eluted therefrom and producing a purified aqueous solution of cobalt chloride having a pH of 0 to 6; and (d) conducting electrolytic refining using said purified aqueous solution as an electrolyte to obtain electrodeposited cobalt.

Further, it has been found that in the above combined anion exchange/process-electrolytic refining process, certain organic materials gradually flow out from the anion exchange resin into the eluting solution. This occurs, for example, during the process of mixing the resin into an electrolyte. The organic materials may in turn contaminate targets produced from an electro-deposited cobalt as gas components such as carbon, oxygen and the like. It has been confirmed that by using the combined anion exchange process-electrolytic refining process incorporating active carbon treatment, further combined with a vacuum melting process as necessary, a high purity cobalt for sputtering targets may be stably and easily produced at low cost on a mass production basis. The high purity cobalt not only has a reduced content of alkali metal elements, radioactive elements and transition metal elements, but also has a reduced content of gas components.

Based on these further findings, this invention provides a process for producing a high purity cobalt comprising the steps of:

(a) contacting an aqueous solution of cobalt chloride having a hydrochloric acid concentration of 7 to 12N, said solution including at least either or both of Fe and Ni as impurities, with an anion exchange resin so that cobalt is adsorbed on the anion exchange resin;

(b) eluting the cobalt with the use of hydrochloric acid as an eluting solution having a concentration of 1 to 6N;

(c) vaporizing and drying or otherwise concentrating the solution having cobalt eluted therefrom and producing a purified aqueous solution of cobalt chloride having a pH of 0 to 6;

(d) removing organic materials in the purified aqueous solution of cobalt chloride by active carbon treatment; and (e) conducting electrolytic refining using the purified aqueous solution as an electrolyte to obtain electro-deposited cobalt.

More specifically, this invention provides a process for producing a high purity cobalt comprising the steps of:

(a) contacting an aqueous solution of cobalt chloride having a hydrochloric acid concentration of 7 to 12N, said solution including at least either or both of Fe and Ni, alkali metals including Na and K, and radioactive metals including U and Th as impurities, with an anion exchange resin so that cobalt, Fe and U are adsorbed on the anion exchange resin;

(b) eluting the cobalt with the use of hydrochloric acid as an eluting solution having a concentration of 1 to 6N;

(c) vaporizing and drying or otherwise concentrating the solution having cobalt eluted and producing a purified aqueous solution of cobalt chloride having a pH of 0 to 6;

(d) removing organic materials derived from said anion exchange resin in the purified aqueous solution of cobalt chloride by active carbon treatment; and (e) conducting electrolytic refining using the purified aqueous solution as an electrolyte to obtain electro-deposited cobalt.

Since it is possible that impurities such as Fe are contained in the active carbon in a considerable amount, it is recommended to treat the active carbon beforehand with an acid.

In the above process, when the electrolytic refining is conducted, it is preferable that the anode and cathode are partitioned with a diaphragm or anion exchange membrane, and the purified aqueous solution of cobalt chloride is charged into the cathode side at least intermittently while the anolyte is withdrawn at least intermittently. It is also preferable that the withdrawn anolyte is contacted with the anion exchange resin after its hydrochloric acid has been adjusted to 7 to 12N for reuse.

It is desirable that the electro-deposited cobalt is melted in a vacuum melting process such as an electron beam melting or other vacuum melting process to remove minor quantities of volatile elements such as Na and K contained therein.

In another aspect, this invention provides (A) a high purity cobalt sputtering target wherein the Na content is 0.05 ppm or less; the K content is 0.05 ppm or less; the Fe content is 1 ppm or less; the Ni content is 1 ppm or less; the Cr content is 1 ppm or less; the U content is 0.01 ppb or less; the Th content is 0.01 ppb or less; the C content is 50 ppm or less; and the O content is 100 ppm or less, the balance being cobalt and unavoidable impurities; and (B) a high purity cobalt sputtering target wherein the Na content is 0.05 ppm or less; the K content is 0.05 ppm or less; the Fe content is 1 ppm or less; the Ni content is 1 ppm or less; the Cr content is 1 ppm or less; the U content is 0.01 ppb or less; the Th content is 0.01 ppb or less; the C content is 10 ppm or less; and the O content is 100 ppm or less, the balance being cobalt and unavoidable impurities.

DETAILED DESCRIPTION OF THE INVENTION

An aqueous solution of cobalt chloride used in this invention is not particularly specified, but, generally, commercially available so-called crude cobalt containing tens of ppm Fe and several hundred ppm Ni as impurities is used. The crude cobalt is dissolved in hydrochloric acid.

On the other hand, hydrochloric acid used for dissolving crude cobalt is not particularly limited and even industrial low purity hydrochloric acid may be used. This is because impurities contained in hydrochloric acid can be removed together with impurities in cobalt through the process of the invention.

Equipment for dissolving cobalt is desirably provided with a cooling drum or jacket and a device for recovering hydrogen chloride gas for the purpose of the effective use of hydrochloric acid. Materials such as quartz, graphite, polytetrafluoroethylene (TEFLON, Trade Mark of Du Pont Company), polyethylene or other polymers may be used for the equipment.

The temperature at which melting is carried out is in the range of 50° to 100° C., preferably 80° to 95° C. At temperatures less than 50° C., the melting speed is too slow, while on the other hand at temperatures above 100° C. vaporization is violent with a large loss of the solution.

The concentration of hydrochloric acid in the aqueous cobalt chloride solution is preferably controlled to 7 to 12N at the final stage. When it is less than 7N or more than 12N, cobalt is hardly adsorbed upon ion exchange. It is preferable that the cobalt concentration is within the range of 10 to 70 g/l. When the cobalt concentration is less than 10 g/l, a large amount of hydrochloric acid is required with increased cost. On the other hand, when the cobalt concentration is more than 70 g/liter, cobalt chloride precipitation occurs at room temperature, namely about 20° C., in solutions having a higher hychochloric acid concentration. This is not preferable.

In the anion exchange using the above aqueous cobalt chloride solution, cobalt is allowed to be adsorbed on the anion resin. The resin used is not particularly limited so long as it is an anion exchange type. DOWEX 1×8 and DOWEX 2×8 (made by MUROMACHI KAGAKU K. K.) and DIAION SA10 are illustrative.

Cobalt forms a chloride complex in hydrochloric acid having a high concentration, and is present as anion. For the reason, cobalt is allowed to adsorb on the anion exchange resin. Fe and U also exhibit a behavior similar to cobalt and are allowed to adsorb on the anion exchange resin. However, Ni, alkali metals such as Na and K, and Th as main impurities do not form chloride complexes. For this reason, they do not adsorb on the resin and flow out of the resin column.

Further, in order to eliminate impurities remaining in the resin column, the resin is washed using 7 to 12N hydrochloric acid. Outside this concentration range, since the bonding of cobalt onto the anion exchange resin is weak, cobalt may be eluted, which is undesirable.

Next, in order to elute only cobalt adsorbed on the anion exchange resin, 1 to 6N, preferably 3 to 4N, hydrochloric acid is used as the eluting solution. Below 1N, Fe and U adsorbed as impurities are undesirably eluted together with Co. Beyond 6N, the elution of Co from the resin becomes difficult, and the quantity of hydrochloric acid which must be used becomes undesirably large.

Fe and U remaining adsorbed on the anion exchange resin can be easily eluted by the use of hydrochloric acid having a concentration of less than 1N. Therefore, the anion exchange resin may be regenerated by conducting the elution of Fe and U at a suitable stage, taking the adsorption capacity of the anion exchange resin used and other factors into consideration.

The aqueous cobalt chloride solution having cobalt eluted therefrom, can not be used for electrolytic refining since the concentration of hydrochloric acid is too high. According to the invention, the aqueous cobalt chloride solution is vaporized to dryness or otherwise concentrated, followed by the addition of water to produce a purified aqueous solution of cobalt chloride having a pH of 0 to 6. The purified aqueous solution is used as an electrolyte.

It is recommended that the procedure of vaporization to dryness, or concentration, is conducted using a rotary evaporation device or the like. The temperature for the vaporization to dryness or concentration procedure is no less than 80° C., preferably no less than 100° C. When the temperature is lower than 80° C., the time period required for the vaporization or concentration is too long. The time period required for the vaporization or concentration may be shortened by conducting the procedure under a slight depressurization with the use of an aspirator or the like. The material comprising the equipment for use in the vaporization or concentration procedure is preferably, quartz, graphite, polytetrafluoroethylene (TEFLON, Trade Mark of Du Pont Company) or the like. The hydrogen chloride gas generated is cooled and condensated for reuse in the steps of cobalt melting or anion exchange.

Also, there is the possibility that organic materials in the anion exchange resin (styrene, divinylbenzene, amines and the others) may gradually flow out of the resin into the solution. In such a case, active carbon treatment is conducted to remove such organic materials. Active carbon possibly contains impurities such as Fe. It is preferable to use the carbon after having been acid-treated with hydrochloric acid or the like to wash out the impurities. Active carbons are available in the form of particles, fibers, powders etc. Any of these forms may be used so long as impurities such as Fe are not included.

The active carbon treatment is normally performed after vaporizing and drying or concentrating the aqueous cobalt chloride solution which has had the cobalt eluted therefrom, followed by the addition of water to adjust the solution pH to 0 to 6. It is not necessary however to perform the steps in this order. The active carbon treatment may be carried out at any time in the process, from the cobalt elution to the electrolytic refining.

The pH of the aqueous cobalt chloride solution thus prepared for use as an electrolyte is adjusted to 0 to 6, preferably 1 to 4. When the pH is less than 0, the quantity of hydrogen evolved increases and current efficiency is undesirably lowered. A pH beyond 6 is not preferred since cobalt precipitates as cobalt hydroxide.

The concentration of cobalt in the electrolyte during the electrolytic refining is maintained at 10 to 160 g/l, preferably 30 to 130 g/l. A cobalt concentration below 10 g/l is not preferred since the quantity of hydrogen evolved becomes larger with lowered current efficiency. Also, the concentration of impurities in the electro-deposited cobalt rises. When the cobalt concentration is beyond 160 g/l, cobalt chloride precipitates to adversely affect the electro-deposition state.

The current density should be in the range of 0.001 to 0.1 A/cm$^2$. The use of a current density less than 0.001 A/cm$^2$ lowers productivity and is not efficient. When the current density is more than 0.1 A/cm$^2$, the concentration of impurities in the electro-deposited cobalt rise and the current efficiency decreases.

The temperature of the electrolytic refining is in the range of 10° to 90° C., preferably 35° to 55° C. Below 10° C., the current efficiency decreases. On the other hand, beyond 90° C., the vaporization of the electrolyte becomes undesirably vigorous.

A crude cobalt is used as an anode. A sheet of cobalt, titanium or the like may be used as a cathode.

The materials for an electrolytic cell include vinyl chloride, polypropylene, and polyethylene.

In the electrolytic refining, it is preferred to partition the anode and cathode with a diaphragm or anion exchange membrane. The purified aqueous solution of cobalt chloride (constituting the catholyte) is charged into the cathode side at least intermittently while the anolyte is withdrawn at least intermittently, so that impurities dissolved out from the anode do not enter into the cathode side. The quantity of catholyte added is preferably at least equal to the quantity of the anolyte withdrawn.

The diaphragm or anion exchange membrane used in the practice of the invention is not particularly limited. "FILTER CLOTH PP-2020", and "PP-100"(made by YASUZUMI ROSHI K. K.), "TEBIRON 1010" or the like may be used for the diaphragm. "AIONACK MA-3475"(made by MUROMACHI KAGAKU K. K.) and the like may be used as the anion exchange membrane.

The anolyte withdrawn from the electrolytic cell may be recirculated for reuse after adjusting its hydrochloric acid concentration to 7 to 12N, followed by contacting the anolyte with the anion exchange resin. Electrolytic refining may be continuously conducted in this manner.

The expression "at least intermittently" used herein means "continuously or at intervals".

As a result of the electrolytic refining, minor amounts of radioactive elements, such as U and Th remaining in the electrolyte, are separated from cobalt.

The electro-deposited cobalt recovered is melted in a vacuum melting process such as electron beam melting or other vacuum melting process to remove minor quantities of volatile elements such as Na, K or the like contained therein.

In electron beam melting, an electrode (herein, electro-deposited cobalt) is first manufactured and then re-dissolved to obtain a further purified ingot. During the melting of the electrode under high temperature and vacuum, the aforementioned volatile components are vaporized. For example, in the case where the quantity of electrode material to be melted is 5 kg, the electron beam melting is carried out under the following conditions: Current: 0.7 A, Voltage: 20 KV, Vacuum: $10^{-6}$ mmHg, Time period: 2 hr A high purity cobalt produced through the foregoing operations has impurities removed to minimums, and is suitable as a target material for semiconductor applications and other applications. A high purity cobalt sputtering target is obtained wherein the Na content is 0.05 ppm or less; the K content is 0.05 ppm or less; the Fe content is 1 ppm or less; the Ni content is 1 ppm or less; the Cr content is 1 ppm or less; the U content is 0.01 ppb or less; the Th content is 0.01 ppb or less; the C content is 50 ppm or less, preferably 10 ppm or less; and the O content is 100 ppm or less; the balance being cobalt and unavoidable impurities.

EXAMPLES

The invention is illustrated by the following examples and comparative examples. But these examples are not intended to restrict the invention.

Example 1

600 g crude cobalt lump having the purity as shown in Table 1 was charged into a vessel containing about 12.5 liters of 11.6N aqueous hydrochloric acid solution. The temperature was raised to 95° C. and after 7 hours an aqueous cobalt chloride solution having a hydrochloric acid concentration of 9N and a cobalt concentration of 50 g/l was obtained.

12 liters of this solution was passed through a polypropylene column (150 mm diameter×1200 mm length) charged with 12 liters of anion exchange resin (MUROMACHI KAGAKU: DOWEX 2×8) to allow the cobalt to adsorb to the resin followed by washing with 12 liters of 9N hydrochloric acid.

Next, 18 liters of 4N hydrochloric acid was passed through the column to elute cobalt. The aqueous cobalt chloride solution obtained was vaporized to dryness at 140° C. using a rotary evaporation device. 1600 g of vaporized and dried material was obtained as $CoCl_2 \cdot 2H_2O$. The material was dissolved into the pure water to obtain 10 liters of solution having a cobalt concentration of 60 g/l. After adjusting its pH to 1, 5 liters of the purified cobalt solution was charged into an electrolytic cell. The remainder of the solution was used as a catholyte supplying solution.

Next, electrolytic refining was conducted at a current density of 0.02 A/cm² and a temperature of 50° C. using a crude cobalt sheet as a cathode. The anode side and the cathode side of the cell were partitioned with a diaphragm (FILTER CLOTH PP-2020, made by YASUZUMI ROSHI K. K.). The purified aqueous cobalt chloride solution was supplied at the feed rate of 120 ml/hr while withdrawing the anolyte at the same flow rate as in the cathode side. After 40 hrs., 83 g electro-deposited cobalt was obtained with a yield of 95%. The electro-deposited cobalt was subjected to electron beam melting to obtain 79 g high purity cobalt, also with a yield of 95%. The purity of the cobalt obtained from the above operations is also shown in Table 1.

TABLE 1

|  | Fe | Ni | Na | K | U | Th |
| --- | --- | --- | --- | --- | --- | --- |
| Raw material | 20 | 300 | 1.8 | 3.4 | 0.10 | 0.06 |
| $CoCl_2 \cdot 2H_2O$ | 0.05 | 0.07 | <0.05 | <0.05 | <0.01 | <0.01 |

TABLE 1-continued

|  | Fe | Ni | Na | K | U | Th |
| --- | --- | --- | --- | --- | --- | --- |
| Electro-deposited Co | 0.2 | 0.2 | <0.05 | <0.05 | <0.01 | <0.01 |
| After EB melting | 0.2 | 0.2 | <0.05 | <0.05 | <0.01 | <0.01 |

[Unit: ppm, U, Th: ppb]

Example 2

600 g of crude cobalt lump having the purity as shown in Table 2 was charged into a vessel containing about 12.5 liters of 11.6N aqueous hydrochloric acid solution. The temperature was raised to 95° C. and, after 7 hours, an aqueous cobalt chloride solution having a hydrochloric acid concentration of 9N and a cobalt concentration of 50 g/l was obtained.

12 liters of this solution was passed through a polypropylene column (150 mm diameter ×1200 mm length) charged with 12 liters of anion exchange resin (MUROMACH KAGAKU: DOWEX 2×8) to allow the cobalt to adsorb to the resin, followed by washing with 12 liters of 9N hydrochloric acid.

Next, 18 liters of 4N hydrochloric acid was passed through the column to elute cobalt. The aqueous cobalt chloride solution obtained was vaporized to dryness at 110° C. using a rotary evaporation device. 600 g of vaporized and dried material on the basis of Co conversion was obtained as $CoCl_2 \cdot 2H_2O$. The material was dissolved into pure water to obtain 10 liters of solution having a cobalt concentration of 60 g/l.

After adjusting the pH of the solution to 2, organic materials were removed by active carbon treatment.

Five liters of purified cobalt solution was charged into an electrolytic cell. The remainder of the solution was used as a catholyte supplying solution.

The active carbon was washed with 6N hydrochloric acid to remove impurities such as Fe.

Next, electrolytic refining was conducted at a current density of 0.02 A/cm² and a temperature of 50° C. using a crude cobalt sheet as a cathode. The anode side and the cathode side of the cell were partitioned with a diaphragm (FILTER CLOTH PP-2020, made by YASUZUMI ROSHI K. K.). The purified aqueous cobalt chloride solution was supplied at the feed rate of 120 ml/hr while withdrawing the anolyte at the same flow rate as in the cathode side. After 40 hours., 83 g electro-deposited cobalt was obtained with yield of 95%.

The electro-deposit had a flat surface with no irregularity. Peeling of the electro-deposited Co did not occur.

The electro-deposited cobalt was subjected to electron beam melting followed by machining to form a sputtering target.

The purity of electro-deposited cobalt and the cobalt after the electron beam melting are shown in Table 2.

Example 3

An operation was conducted similar to Example 2 except that active carbon was used which had not been acid-treated. The purity of the electro-deposited cobalt obtained by this operation is shown in Table 2. It is observed that the amount of Fe impurity is higher. However, no problem occurs when an active carbon having a lower Fe content is used.

Example 4

An operation was conducted similar to Example 2 except that active carbon treatment was not performed. The purity of the electro-deposited cobalt obtained by this operation is shown in Table 2. The electro-deposited state was characterized by an uneven surface with a part peeling off from the cathode sheet. The material was very brittle.

TABLE 2

|  | Fe | Ni | Na | K | U | Th | C | O | N | H |
|---|---|---|---|---|---|---|---|---|---|---|
| Raw material | 20 | 300 | 1.8 | 3.4 | 0.10 | 0.06 | 100 | 120 | 10 | 40 |
| Example 2 (after electrolytic refining) | 0.2 | 0.2 | <0.05 | <0.05 | <0.01 | <0.01 | 10 | 80 | 8 | 40 |
| Example 2 (after EB melting) | 0.2 | 0.2 | <0.05 | <0.05 | <0.01 | <0.01 | 6 | 80 | 2 | <0.1 |
| Example 3 | 5.5 | 0.2 | <0.05 | <0.05 | <0.01 | <0.01 | 10 | 80 | 8 | 40 |
| Example 4 | 0.2 | 0.2 | <0.05 | <0.05 | <0.01 | <0.01 | 90 | 600 | 40 | 100 |

[Unit: ppm; U, Th: ppb]

Sputterings were made using targets produced in Examples 2, 3 and 4. Test data are given below (Sputtering test data)

(1) Sputtering was carried out using targets produced in Examples 2, 3 and 4. Impurities in the sputtered films were analyzed with GDMS. The results were as follows (the gas components were undetectable).

TABLE 3

Results of quantity analysis for films obtained by sputtering of three types of targets

|  | Fe | Ni | Na | K | U | Th |
|---|---|---|---|---|---|---|
| Example 2 | 0.2 | 0.2 | <0.05 | <0.05 | <0.01 | <0.01 |
| Example 3 | 5.0 | 0.2 | <0.05 | <0.05 | <0.01 | <0.01 |
| Example 4 | 0.2 | 0.2 | <0.05 | <0.05 | <0.01 | <0.01 |

(Unit: ppm; U, TH: ppb)

It should be noted that Fe was detected in Example 3 in a high concentration only.

(2) The above films were subjected to SIMS analysis to qualitatively analyze C, O, N and H. Although the absolute quantities of the respective components were unknown, the Example 2 film exhibited the lowest values of all films. If the intensity of Example 2 is regarded as 1, the relative intensities of Examples 3 and 4 were as follows:

TABLE 4

|  | C | O | N | H |
|---|---|---|---|---|
| Example 2 | 1 | 1 | 1 | 1 |
| Example 2 | 2 | 1 | 4 | >50 |
| Example 3 | 20 | 10 | 20 | >50 |

(3) The electric resistances of the above films was measured with results as follows:

TABLE 5

|  | as deposited | 700° C. annealed |
|---|---|---|
| Example 2 | 35 $\mu\Omega \cdot$ cm | 10 $\mu\Omega \cdot$ cm |
| Example 3 | 36 $\mu\Omega \cdot$ cm | 13 $\mu\Omega \cdot$ cm |

TABLE 5-continued

|  | as deposited | 700° C. annealed |
|---|---|---|
| Example 4 | 40 $\mu\Omega \cdot$ cm | 15 $\mu\Omega \cdot$ cm |

ADVANTAGES OF THIS INVENTION (1) A high purity cobalt having a purity of 5N or more may be produced by using a combined anion exchange process-electrolytic refining process, which is further combined with a vacuum melting process as necessary.

(2) A high purity cobalt having a purity of 5N or more may be produced in an easy operation which provides a cobalt of stable quality at low cost. The high purity cobalt is produced by using a combined anion exchange process-electrolytic refining process which incorporates an active carbon treatment process, which is further combined with a vacuum melting process as necessary.

(3) The high purity cobalt obtained may be used as sputtering target materials for semiconductor device production and production of other devices.

What we claim is:

1. A high purity cobalt sputtering target wherein Na content is 0.05 ppm or less; K content is 0.05 ppm or less; Fe content is 1 ppm or less; Ni content is 1 ppm or less; Cr content is 1 ppm or less; U content is 0.01 ppb or less; Th content is 0.01 ppb or less; C content is 50 ppm or less; and O content is 100 ppm or less, the balance being cobalt and unavoidable impurities.

2. A high purity cobalt sputtering target wherein Na content is 0.05 ppm or less; K content is 0.05 ppm or less; Fe content is 1 ppm or less; Ni content is 1 ppm or less; Cr content is 1 ppm or less; U content is 0.01 ppb or less; Th content is 0.01 ppb or less; C content is 10 ppm or less; and O content is 100 ppm or less, the balance being cobalt and unavoidable impurities.

* * * * *